(12) United States Patent
Furuhata

(10) Patent No.: US 7,407,270 B2
(45) Date of Patent: Aug. 5, 2008

(54) LIQUID JET HEAD AND LIQUID JET APPARATUS

(75) Inventor: Yutaka Furuhata, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 199 days.

(21) Appl. No.: 10/507,592

(22) PCT Filed: Mar. 18, 2003

(86) PCT No.: PCT/JP03/03234

§ 371 (c)(1),
(2), (4) Date: Mar. 28, 2005

(87) PCT Pub. No.: WO03/078167

PCT Pub. Date: Sep. 25, 2003

(65) Prior Publication Data

US 2005/0162481 A1    Jul. 28, 2005

(30) Foreign Application Priority Data

Mar. 18, 2002  (JP) ............................. 2002-074420
Sep. 18, 2002  (JP) ............................. 2002-271446

(51) Int. Cl.
    *B41J 2/05* (2006.01)
(52) U.S. Cl. ...................................................... 347/58
(58) Field of Classification Search .................. 347/58, 347/59, 68; 438/21
    See application file for complete search history.

(56) References Cited

U.S. PATENT DOCUMENTS 5,032,895 A * 7/1991 Horiuchi et al. ............. 257/695
5,781,220 A * 7/1998 Nishizono et al. ........... 347/208
2002/0012029 A1 * 1/2002 Miyata ......................... 347/68

FOREIGN PATENT DOCUMENTS

| EP | 0 550 030 A | 7/1993 |
|---|---|---|
| JP | 62-142660 A | 6/1987 |
| JP | 62-185332 A | 8/1987 |
| JP | 62-138457 U | 9/1987 |
| JP | 2-129936 A | 5/1990 |
| JP | 5-286131 A | 11/1993 |
| JP | 9-266223 A | 10/1997 |
| JP | 11-346042 A | 12/1999 |
| JP | 2000-135789 A | 5/2000 |
| JP | 2000135789 A * | 5/2000 |
| JP | 2001-270125 A | 10/2001 |
| JP | 2002-36547 A | 2/2002 |
| JP | 2002-160366 A | 6/2002 |

* cited by examiner

*Primary Examiner*—Matthew Luu
*Assistant Examiner*—Lisa M Solomon
(74) *Attorney, Agent, or Firm*—Sughrue Mion, PLLC

(57) ABSTRACT

Provided are a liquid jet head and a liquid jet apparatus in which it is possible to securely connect drawn wires and connection wires and to improve reliability. Connection portions 91 of drawn wires 90 drawn from piezoelectric elements 300 and pad portions 101 of a drive IC 100 for driving the piezoelectric elements 300 are connected by connection wires 110 formed by wire bonding and extended in directions intersecting drawing directions of the connection portions 91. Accordingly, the connection wires 110 and the drawn wires 90 are suitably connected.

9 Claims, 10 Drawing Sheets

LIQUID JET HEAD AND LIQUID JET APPARATUS

TECHNICAL FIELD

The present invention relates to a liquid jet head and a liquid jet apparatus which cause nozzle orifices to eject liquid droplets by having piezoelectric elements pressurize liquid supplied to pressure generating chambers and, more particularly, to an ink-jet recording head and an ink-jet recording apparatus which cause ink in its liquid form to be ejected.

BACKGROUND ART

In an ink-jet recording head, a vibration plate constitutes part of pressure generating chambers communicating with nozzle orifices which eject ink droplets. Piezoelectric elements deform this vibration plate to pressurize ink in the pressure generating chambers, thereby causing the nozzle orifices to eject the ink droplets. There are two types of piezoelectric actuators which have been employed by this ink-jet recording head for practical use: a piezoelectric actuator of a longitudinal vibration mode which extends and contracts in an axial direction of the piezoelectric elements; and a piezoelectric actuator of a flexure vibration mode. A well-known example of the ink-jet recording head employing the actuator of the flexure vibration mode is as follows: a uniform piezoelectric material layer is formed over the entire surface of the vibration plate by deposition technology; this piezoelectric material layer is cut into pieces by use of a lithography method so that the shape thereof becomes suitable for the pressure generating chambers; and the piezoelectric elements are formed independently for the respective pressure generating chambers. Moreover, these piezoelectric elements are generally driven by a drive IC (semiconductor integrated circuit) or the like, and the drive IC is mounted on, for example, a joint plate joined with one side of a passage-forming substrate on which the pressure generating chambers are formed. This drive IC and drawn wires drawn from the respective piezoelectric elements are electrically connected by connection wires, which are formed by wire bonding (e.g., refer to Japanese Unexamined Patent Publication No. 2002-160366).

However, such an ink-jet recording head has a problem that adjacent drawn wires are short-circuited when the drawn wires and connection wires are connected. This is because widths of the drawn wires and the pitch thereof are narrowed in line with a shift toward high-density piezoelectric elements. In other words, there is a problem that the adjacent drawn wires are short-circuited by the connection wires projecting to the outside of the drawn wires since regions of the drawn wires connected to the connection wires are narrowed. In addition, there is another problem that connection strengths degrade between the connection wires and the drawn wires if connection areas between the two are extremely small. Note that these problems arise not only in the ink-jet recording head which ejects ink, but also in other liquid jet heads which eject liquid other than ink.

DISCLOSURE OF THE INVENTION

In consideration of the foregoing circumstances, an object of the present invention is to provide a liquid jet head and a liquid jet apparatus in which it is possible to securely connect the drawn wires and the connection wires and improve the reliability thereof.

A first aspect of the present invention achieving the foregoing object is as follows: a liquid jet head has a passage-forming substrate and piezoelectric elements; pressure generating chambers communicating with nozzle orifices are formed on the passage-forming substrate; the piezoelectric elements include a lower electrode, piezoelectric layers and upper electrodes and are provided on one side of the passage-forming substrate through a vibration plate; and the liquid jet head is characterized in that connection portions of drawn wires drawn from the piezoelectric elements and pad portions of a drive IC for driving the piezoelectric elements are connected by connection wires formed by wire bonding and extended in directions intersecting drawing directions of the connection portions of the drawn wires.

In the first aspect, contact areas between the drawn wires and the connection wires substantially increase, thereby improving a connection strength.

A second aspect of the present invention is as follows: in the first aspect, the liquid jet head is characterized in that the connection portions have a shape different from that of main body portions of the drawn wires and a shape such that the connection wires can be bonded within regions of the connection portions.

In the second aspect, it is possible to suppress projection amounts of the connection wires and prevent connection defects such a short circuit of adjacent lead electrodes when the connection wires are connected to the connection portions of the lead electrodes.

A third aspect of the present invention is as follows: in the second aspect, the liquid jet head is characterized in that at least one end faces in a width direction of the connection portions projects toward the outside further than other portions of the drawn wires.

In the third aspect, it is possible to relatively easily secure regions with which connection wires can be bonded in the connection portions of the drawn wires.

A fourth aspect of the present invention is as follows: in the second or third aspect, the liquid jet head is characterized in that the connection portions of the drawn wires have different shapes depending on extension directions of the connection wires.

In the fourth aspect, the connection portions of the drawn wires are formed with optimum shapes, and thus the drawn wires and the connection wires are suitably connected.

A fifth aspect of the present invention is as follows: in the fourth aspect, the liquid jet head is characterized in that at least one of the end faces of each connection portion is formed along the extension direction of the connection wire.

In the fifth aspect, the connection portions of the drawn wires are formed with optimum shapes in accordance with the extension directions of the connection wires, and thus the drawn wires and the connection wires are suitably connected.

A sixth aspect of the present invention is as follows: in any one of the second to fifth aspects, the liquid jet head is characterized in that the connection portions of the adjacent drawn wires are provided in different positions in a longitudinal direction of the drawn wires.

In the sixth aspect, since the intervals between the connection portions are substantially increased, the connection wires are not mutually short-circuited even when the drawn wires are aligned with relatively high density.

A seventh aspect of the present invention is as follows: in the sixth aspect, the liquid jet head is characterized in that concave portions for preventing electrical contact with the connection portions are formed in regions of the drawn wires corresponding to the connection portions of the adjacent drawn wires.

In the seventh aspect, it is possible to prevent the drawn wires from being mutually short-circuited and to align the drawn wires with high density.

An eighth aspect of the present invention is as follows: in the first aspect, the liquid jet head is characterized in that the connection portions are provided to be slanted along extension directions of the connection wires from main body portions of the drawn wires, and a width of the connection portions is narrower than the maximum width of bonding regions of the connection wires and equal to or wider than ⅓ of the maximum width.

In the eighth aspect, a short circuit will not occur due to projections of the connection wires, and the connection strength can be secured.

A ninth aspect of the present invention is as follows: in the eighth aspect, the liquid jet head is characterized in that the pitch of the adjacent connection portions is narrower than the maximum width of the bonding regions of the connection wires.

In the ninth aspect, the piezoelectric elements can be aligned with high density.

A tenth aspect of the present invention is as follows: in any one of the first to ninth aspects, the liquid jet head is characterized in that an angle between the extension directions of the connection wires and extension directions of the connection portions is in a range of 45°±15°.

In the tenth aspect, it is possible to effectively suppress the projection amounts when the connection wires are connected to the connection portions of the lead electrodes. Thus, it is possible to more securely prevent the connection defects such as a short circuit of the adjacent lead electrodes.

An eleventh aspect of the present invention is as follows: in any one of the first to tenth aspects, the liquid jet head is characterized in that a width of the drawn wires is equal to or narrower than a width of the pad portions provided in the drive IC.

In the eleventh aspect, it is possible to align the piezoelectric elements with high density and achieve high-quality print.

A twelfth aspect of the present invention is as follows: in any one of the first to eleventh aspect, the liquid jet head is characterized in that the pitch of the drawn wires and the pitch of the pad portions provided in the drive IC are the same.

In the twelfth aspect, it is possible to more securely prevent the connection defects since all the drawn wires drawn from the piezoelectric elements and the connection wires are connected under the same conditions.

A thirteenth aspect of the present invention is as follows: in any one of the first to twelfth aspect, the liquid jet head is characterized in that a sealing plate having a piezoelectric element holding portion in a region facing the piezoelectric elements is joined with a side of the passage-forming substrate where the piezoelectric elements are provided, and the drive IC is installed on the sealing plate.

In the thirteenth aspect, by the connection wires formed by wire bonding, it is possible to suitably connect the drawn wires and the pad portions of the drive IC and miniaturize the head.

A fourteenth aspect of the present invention is as follows: in any one of the first to thirteenth aspects, the liquid jet head is characterized in that the pad portions of the drive IC are aligned in slanted directions with respect to the extension directions of the connection wires.

In the fourteenth aspect, the connection wires are extended in directions intersecting the drawn wires as a result, and the contact areas between the connection wires and the drawn wires are increased.

A fifteenth aspect of the present invention is as follows: in any one of the first to fourteenth aspects, the liquid jet head is characterized in that the connection wires provided at least in the vicinity of an edge of the passage-forming substrate are longer than the connection wires provided in the central portion of the passage-forming substrate.

In the fifteenth aspect, at least the connection wires provided in the vicinity of the edge of the passage-forming substrate can be deformed in a predetermined range. Thus, it is possible to prevent the connection defects between the connection wires and the drawn wire seven when the head is deformed due to heat.

A sixteenth aspect of the present invention is as follows: in the fifteenth aspect, the liquid jet head is characterized in that the drawn wires extended to the vicinity of the edge of the passage-forming substrate and the drawn wires extended to the central portion of the passage-forming substrate are different in length.

In the sixteenth aspect, it is possible to relatively easily change the lengths of the connection wires.

A seventeenth aspect of the present invention is as follows: in the fifteenth or sixteenth aspect, the liquid jet head is characterized in that a height of the connection wires provided at least in the vicinity of the edge of the passage-forming substrate from the drawn wires is higher than a height of the connection wires provided in the central portion of the passage-forming substrate.

In the seventeenth aspect, a range in which the connection wires can be deformed becomes relatively large. Accordingly, it is possible to more securely prevent the connection defects between the connection wires and the drawn wires.

An eighteenth aspect of the present invention is as follows: in any one of the fifteenth to seventeenth aspect, the liquid jet head is characterized in that the connection wires provided closer to the edge of the passage-forming substrate are longer.

In the eighteenth aspect, it is possible to more effectively prevent the connection defects between the connection wires and the drawn wires.

A nineteenth aspect of the present invention is as follows: a liquid jet head has a passage-forming substrate and piezoelectric elements; pressure generating chambers communicating with nozzle orifices are formed on the passage-forming substrate; the piezoelectric elements include a lower electrode, piezoelectric layers and upper electrodes and are provided on one side of the passage-forming substrate through a vibration plate; and the liquid jet head is characterized in that drawn electrodes drawn from the piezoelectric elements and a drive IC for driving the piezoelectric elements are connected by connection wires formed by wire bonding, and at least the connection wires provided in the vicinity of an edge of the passage-forming substrate are longer than the connection wires provided in the central portion of the passage-forming substrate.

In the nineteenth aspect, at least the connection wires provided in the vicinity of the edge of the passage-forming substrate can be deformed in a predetermined range. Thus, it is possible to prevent connection defects between the connection wires and the drawn wires even when the head is deformed due to heat.

A twentieth aspect of the present invention is as follows: in the nineteenth aspect, the liquid jet head is characterized in that the drawn wires extended to the vicinity of the edge of the passage-forming substrate and the drawn wires extended to the central portion of the passage-forming substrate are different in length.

In the twentieth aspect, it is possible to relatively easily change the lengths of the connection wires.

A twenty-first aspect of the present invention is as follows: in the nineteenth or twentieth aspect, the liquid jet head is characterized in that a height of the connection wires provided at least in the vicinity of the edge of the passage-forming substrate from the drawn wires is higher than a height of the connection wires provided in the central portion of the passage-forming substrate.

In the twenty-first aspect, a range in which the connection wires can be deformed becomes relatively large. Thus, it is possible to more securely prevent the connection defects between the connection wires and the drawn wire.

A twenty-second aspect of the present invention is as follows: in any one of the nineteenth to twenty-first aspect, the liquid jet head is characterized in that the connection wires provided closer to the edge of the passage-forming substrate are longer.

In the twenty-second aspect, it is possible to more effectively prevent the connection defects between the connection wires and the drawn wires.

A twenty-third aspect of the present invention is as follows: a liquid jet head has a passage-forming substrate and piezoelectric elements; pressure generating chambers communicating with nozzle orifices are formed on the passage-forming substrate; the piezoelectric elements include a lower electrode, piezoelectric layers and upper electrodes and are provided on one side of the passage-forming substrate through a vibration plate; and the liquid jet head is characterized in that drawn wires drawn from the piezoelectric elements onto the passage-forming substrate and pad portions of a drive IC for driving the piezoelectric elements are connected by connection wires formed by wire bonding, and an angle between extension directions of the connection wires and extension directions of connection portions, to which the connection wires are connected, of the drawn wires is in a range of 45°±15°.

In the twenty-third aspect, contact areas between the drawn wires and the connection wires substantially-increase, thereby improving a connection strength. Moreover, it is possible to suppress projection amounts when the connection wires are connected to the connection portions of lead electrodes. Thus, it is possible to prevent connection defects such as a short circuit of the adjacent lead electrodes.

A twenty-fourth aspect of the present invention is as follows: in the twenty-third aspect, the liquid jet head is characterized in that a width of the drawn wires is equal to or narrower than a width of the pad portions provided in the drive IC.

In the twenty-fourth aspect, it is possible to align the piezoelectric elements with high density, thereby achieving high-quality print.

A twenty-fifth aspect of the present invention is as follows: in the twenty-third or twenty-fourth aspect, the liquid jet head is characterized in that the pitch of the drawn wires and the pitch of the pad portions provided in the drive IC are the same.

In the twenty-fifth aspect, all the drawn wires drawn from the piezoelectric elements and the connection wires are connected under the same conditions. Thus, it is possible to more securely prevent connection defects.

A twenty-sixth aspect of the present invention is as follows: in any one of the twenty-third to twenty-fifth aspects, the liquid jet head is characterized in that a sealing plate having a piezoelectric element holding portion in a region facing the piezoelectric elements is joined with a side of the passage-forming substrate where the piezoelectric elements are formed, and the drive IC is installed on the sealing plate.

In the twenty-sixth aspect, by the connection wires formed by wire bonding, it is possible to suitably connect the drawn wires and the pad portions of the drive IC and miniaturize the head.

A twenty-seventh aspect of the present invention is as follows: in any one of the first to twenty-sixth aspects, the liquid jet head is characterized in that the pressure generating chambers are formed by performing anisotropic etching on a single crystal silicon substrate, and each layer of the piezoelectric elements is formed by deposition and lithography methods.

In the twenty-seventh aspect, it is possible to relatively easily manufacture large quantities of the liquid jet heads having the nozzle orifices with high density.

A twenty-eighth aspect of the present invention is as follows: a liquid jet apparatus is characterized by including a liquid jet head in any one of the first to twenty-seventh aspects.

In the twenty-eighth aspect, it is possible to realize a liquid jet apparatus in which reliability and durability are improved.

BEST MODE FOR CARRYING OUT THE PRESENT INVENTION

The present invention will be described in detail below based on embodiments.

Embodiment 1

Figure 1:
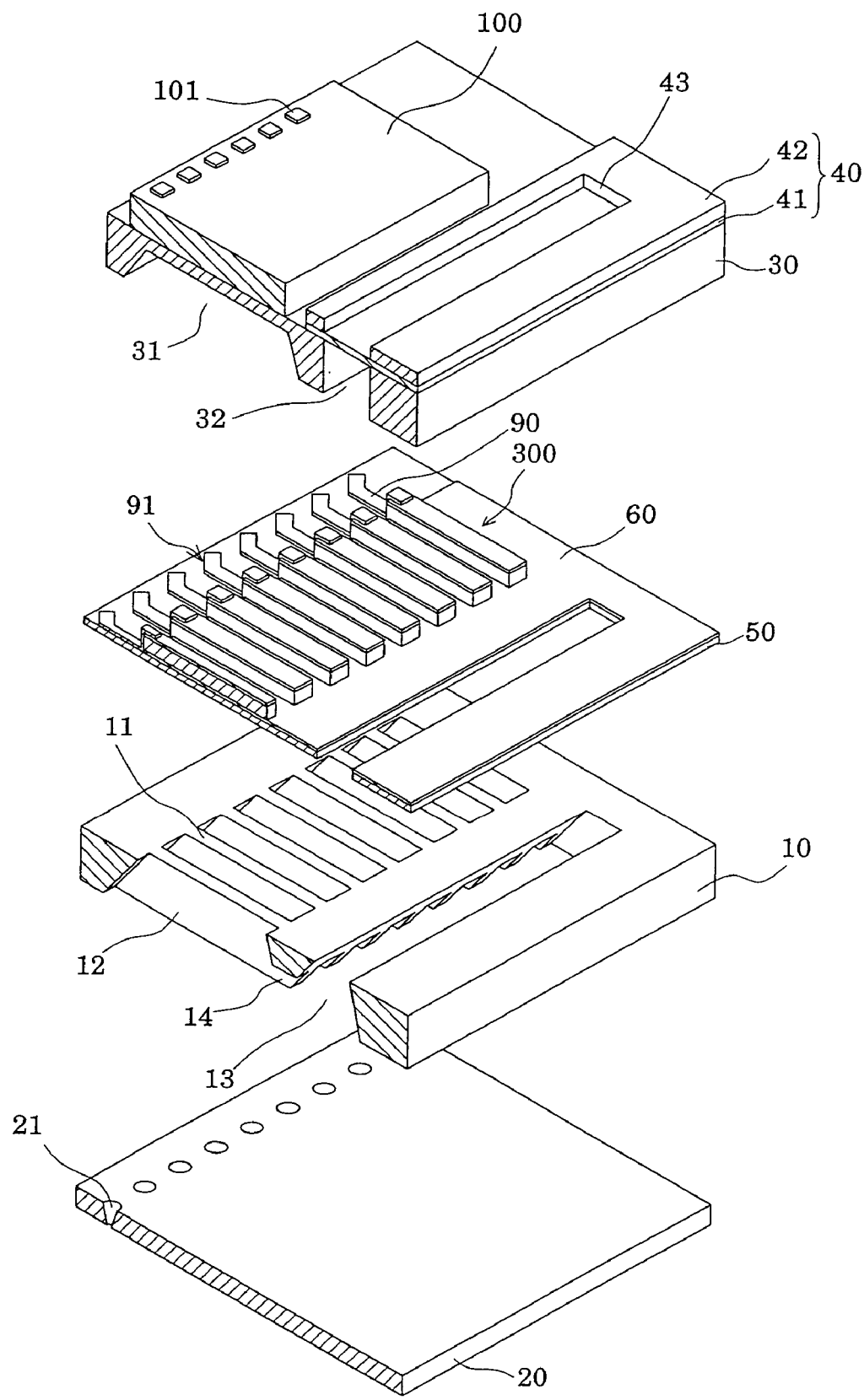
FIG. 1 is an exploded perspective view of a recording head according to Embodiment 1.
Figure 2:
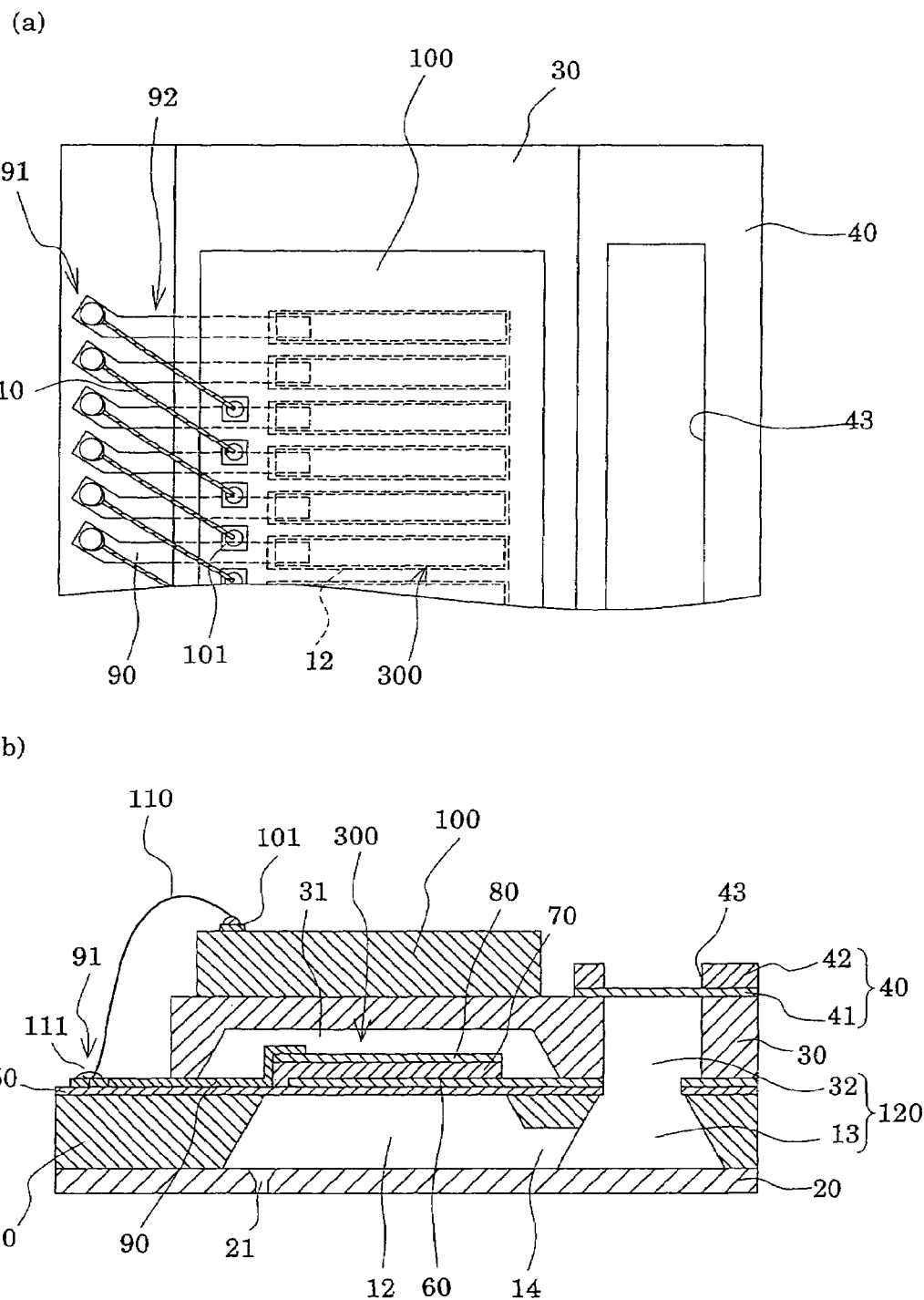
FIGS. 2(a) and 2(b) are a plan view and a sectional view of the recording head according to Embodiment 1, respectively.

FIG. 1 is an exploded perspective view showing an ink-jet recording head according to Embodiment 1 of the present invention. FIGS. 2(a) and 2(b) are a plan view and a sectional view of FIG. 1, respectively. As shown in the drawings, a passage-forming substrate 10 is made of a single crystal silicon substrate with a plane orientation (110) in the present embodiment, and a plurality of pressure generating chambers 12 formed by anisotropic etching are aligned on one side of the passage-forming substrate 10 in a width direction of the pressure generating chambers 12. Moreover, a communicating portion 13 is formed on the outside in a longitudinal direction of the pressure generating chambers 12. This communicating portion 13 communicates with a reservoir portion 32 of a sealing plate 30 mentioned below to constitute part of a reservoir 120 which serves as a common ink chamber for the pressure generating chambers 12. The communicating portion 13 communicates with one set of ends of the pressure generating chambers in the longitudinal direction through respective ink supply paths 14. One side of the passage-forming substrate 10 is an opening surface, and an elastic film 50 with a thickness of 1 to 2 µm is formed on the other side. This elastic film 50 is made of silicon dioxide which is formed through thermal oxidation in advance.

Herein, the anisotropic etching is performed utilizing a difference between etching rates of the single crystal silicon substrate. For example, in the present embodiment, the single crystal silicon substrate is dipped in an alkaline solution such as KOH and gradually eroded. Accordingly, a first (111) plane and a second (111) plane appear. The first (111) plane is perpendicular to a (110) plane, and the second (111) plane makes an angle of approximately 70 degrees with the first (111) plane and an angle of approximately 35 degrees with the foregoing (110) plane. The anisotropic etching is performed utilizing the characteristics that the etching rate of the (111) plane is approximately $\frac{1}{180}$ of that of the (110) plane. This anisotropic etching enables high-precision processing based on the depth processing of a parallelogram formed by two first (111) planes and two slanted second (111) planes. Thus, the pressure generating chambers 12 can be aligned with high density. In the present embodiment, long sides and short sides of each pressure generating chamber 12 are formed by the first (111) planes and the second (111) planes, respectively. These pressure generating chambers 12 are formed by etching so as to substantially penetrate the passage-forming substrate 10 until reaching the elastic film 50.

Herein, the area of the elastic film 50 eroded by the alkaline solution, which etches the single crystal silicon substrate, is extremely small. In addition, the ink supply paths 14 communicating with the one end of each pressure generating chambers 12 are formed to be shallower than the pressure generating chambers 12 to constantly maintain the passage resistance of ink which flows into the pressure generating chambers 12. In other words, the ink supply paths 14 are formed by etching the single crystal silicon substrate halfway in its thickness direction (half etching) Note that the half etching is performed by adjusting the etching time.

For the thickness of the passage-forming substrate 10, on which the pressure generating chambers 12 and the like are formed, an optimum thickness is preferably selected in accordance with an array density of the pressure generating chambers 12. For example, when the pressure generating chambers 12 are disposed at approximately 180 pieces per inch (180 dpi), the thickness of the passage-forming substrate 10 is preferably around 180 to 280 µm, and more preferably around 220 µm. Moreover, for example, when the pressure generating chambers 12 are disposed with relatively high density of around 360 dpi, the thickness of the passage-forming substrate 10 is preferably 100 µm or less. It is because the array density can be increased while the rigidity of compartment walls between the adjacent pressure generating chambers 12 is maintained.

On the opening surface of the passage-forming substrate 10, a nozzle plate 20 is fixed through an adhesive agent, a thermo welding film or the like. Nozzle orifices 21 are provided on the nozzle plate 20 to communicate with the respective pressure generating chambers 12 on the opposite side to the ink supply paths 14. The nozzle plate 20 is made of glass ceramics, a single crystal silicon substrate, stainless steel or the like, the thickness of which is, for example, 0.03 to 1 mm, and the linear expansion coefficient of which is 300° C. or less, for example, 2.5 to 4.5 ($\times 10^{-6}/°$ C.) The size of the pressure generating chambers 12 which give ink droplet ejecting pressure to ink, and the size of the nozzle orifices 21 which eject ink droplets are optimized in accordance with an ejecting amount of the ink droplets, ejecting speed and ejecting frequency. For example, the nozzle orifices 21 need to be formed precisely with a diameter of several 10s µm to record 360 ink droplets per inch.

By the under mentioned process, a lower electrode film 60, piezoelectric layers 70 and upper electrode films 80 are stacked and formed on the elastic film 50, opposite the opening surface of the passage-forming substrate 10, to constitute piezoelectric elements 300. The thicknesses of the lower electrode film 60, the piezoelectric layers 70 and the upper electrode films 80 are, for example, approximately 0.2 µm, 0.5 to 3 µm and 0.1 µm, respectively. Herein, the piezoelectric elements 300 are portions, each including the lower electrode film 60, the piezoelectric layer 70 and the upper electrode film 80. The piezoelectric elements 300 are generally structured such that any one of the electrodes is set as a common electrode, and the other electrode and the piezoelectric layer 70 are patterned for each pressure generating chamber 12. A portion which is structured by the patterned electrode and the piezoelectric layer 70 and where piezoelectric distortion occurs by applying voltage to both the electrodes is referred to as a piezoelectric active portion. In the present embodiment, the lower electrode film 60 is the common electrode of the piezoelectric elements 300, and the upper electrode films 80 are individual electrodes of the piezoelectric elements 300. However, these can be reversed depending on a drive IC or wiring without causing any trouble. In any case, the piezoelectric active portion is formed for each pressure generating chamber. Moreover, the piezoelectric elements 300 and a vibration plate in which displacement occurs by driving the piezoelectric elements 300 are generically referred to as a piezoelectric actuator.

Further, lead electrodes 90, which are drawn wires, are connected to the vicinities of one end of the respective upper electrode films 80, which are the individual electrodes of the piezoelectric elements 300, in a longitudinal direction of the upper electrode films 80. The lead electrodes 90 are made of, for example, gold (Au) and drawn to the vicinity of an edge of the passage-forming substrate 10 with a predetermined width. For example, in the present embodiment, the piezoelectric elements 300 are formed with an array density of 360 dpi, and the lead electrodes 90 are formed with a width of 45 to 47 µm and a pitch of approximately 70 µm. Note that the vicinities of one end of the lead electrodes 90 are connection portions 91 to which connection wires 110 extended from a drive IC 100 for driving the piezoelectric elements 300 are connected. This will be detailed later.

To the passage-forming substrate 10 at the piezoelectric element 300 side, joined is the sealing plate 30 having a piezoelectric element holding portion 31 which can seal a space in a state of securing a space which does not disturb operation of the piezoelectric elements 300. The piezoelectric elements 300 are sealed in this piezoelectric element holding portion 31. Moreover, the sealing plate 30 has the reservoir portion 32, which constitutes at least part of the reservoir 120, in a region facing the communicating portion 13 of the passage-forming substrate 10. In the present embodiment, this reservoir portion 32 is formed in the width direction of the pressure generating chambers 12, penetrating the sealing plate 30 in its thickness direction. As described above, the reservoir portion 32 communicates with the communicating portion 13 of the passage-forming substrate 10, thereby constituting the reservoir 120, the common ink chamber for the pressure generating chambers 12. For the sealing plate 30, it is preferable to employ a material having substantially the same coefficient of thermal expansion as that of the passage-forming substrate 10, such as glass or a ceramic material. In the present embodiment, a single crystal silicon substrate, the same material used for the passage-forming substrate 10, is employed to form the sealing plate 30.

Moreover, the drive IC (semiconductor integrated circuit) 100 for driving the piezoelectric elements 300 is mounted on the sealing plate 30. Pad portions 101 of the drive IC 100 and the lead electrodes 90 drawn from the piezoelectric elements 300 are electrically connected by the connection wires 110 which are formed by wire bonding. In addition, the drive IC 100 is mounted in a position slightly deviated from a region facing a column of the piezoelectric elements 300 in an aligning direction of the piezoelectric elements 300. The connection wires 110 which connect the pad portions 101 and the lead electrodes 90 are extended in directions intersecting extension directions of the lead electrodes 90. In the present embodiment, since the lead electrodes 90 and the pad portions 101 are aligned at the same pitch, each connection wire 110 is extended in the same direction. In other words, the connection wires 110 are aligned to be parallel to each other.

In the present embodiment, the connection portions 91 of the lead electrodes 90 to which the connection wires 110 are connected, and other portions, in other words, main body portions 92 have different shapes. For example, the connection portions 91 have a shape such that at least one end faces in a width direction of the connection portions 91 project from the main body portions 92 of the lead electrodes 90, and such that the connection wires 110 can be bonded with the inside of the connection portions 91. In other words, the connection portions 91 of the lead electrodes 90 are formed so that bonding portions 111 of the connection wires 110 can be formed inside the connection portions 91.

The connection portions 91 are preferably formed into different shapes in accordance with an extension direction of each connection wire 110. In particular, the connection portions 91 are preferably formed along the extension directions of the connection wires 110. For example, in the present embodiment, the connection portions 91 of the lead electrodes 90 are drawn along the extension directions of the connection wires 110, and both end faces in the width direction of the connection portions 91 are made to coincide with the extension directions of the connection wire 110.

When the piezoelectric elements 300 are aligned with relatively high density, the array pitch of the connection portions 91 of the lead electrodes 90 drawn from the piezoelectric elements 300 sometimes become wider than the array pitch of the pads 101 of the drive IC 100. In this case, since the extension directions of the connection wires 110 are different depending on each piezoelectric element 300, the connection portions 91 are preferably formed into different shapes in accordance with the extension directions of the respective connection wires 110. For example, both the end faces in the width direction of each connection portion 91 are preferably formed to substantially coincide with the extension direction of the corresponding connection wire 110.

In this structure, the connection wires 110 are connected to the connection portions 91 of the lead electrodes 90 in extension directions of the connection portions 91. Accordingly, the bonding portions 111 of the connection wires 110 are securely formed in the connection portions 91 without projecting toward the outside of the connection portions 91 of the lead electrodes 90. Thus, the lead electrodes 90 and the connection wires 110 can be securely connected in a predetermined area. Even when the piezoelectric elements. 300 are aligned with high density, the lead electrodes 90 and the connection wires 110 can be electrically connected securely. Moreover, even when the array pitch of the drawn wires 90 and the pitch of the pad portions 101, to which the connection wires 110 of the drive IC 100 are connected, are different, the lead electrodes 90 and the connection wires 110 can be suitably connected.

Moreover, since it is only necessary to set the shapes of the connection portions 91 of the lead electrodes 90 to be predetermined shapes, it is relatively easy to form the lead electrodes 90. Furthermore, it is unnecessary to increase the entire widths of the lead electrodes 90, and the areas of the lead electrodes 90 can be relatively small. Accordingly, even when a relatively expensive material such as gold (Au) is employed, manufacturing costs can be reduced.

Figure 3:
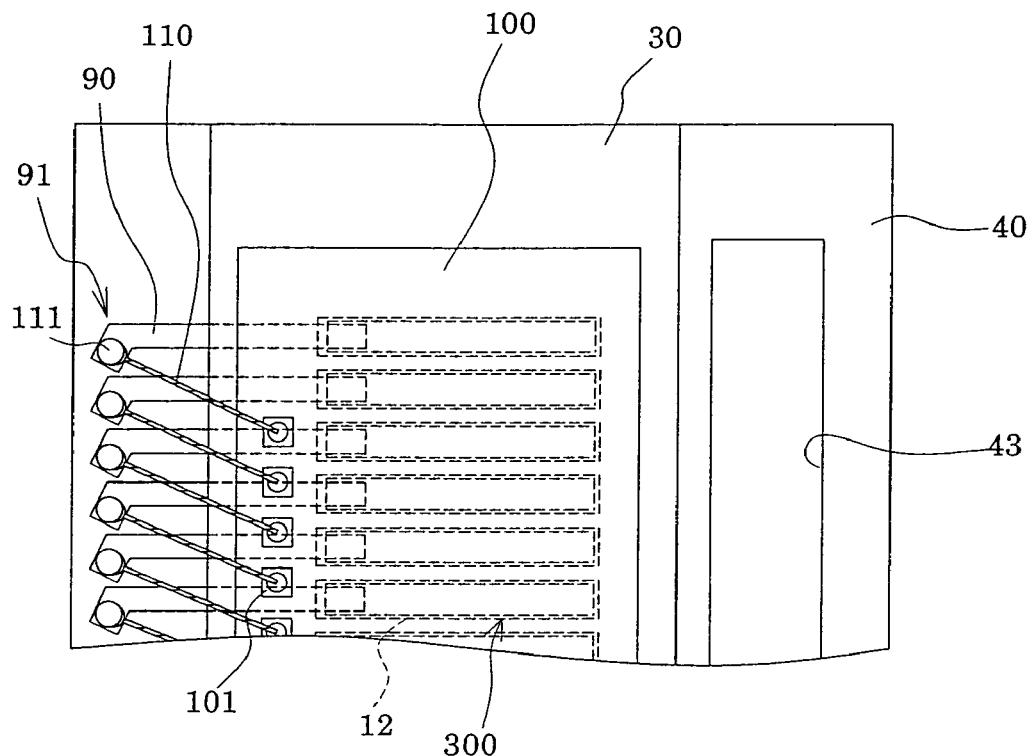
FIG. 3 is a plan view showing a modification example of the recording head according to Embodiment 1.

Note that, in the present embodiment, although the connection portions 91 of the lead electrodes 90 are formed along the extension directions of the connection wires 110, the formation is not limited to this. For example, as shown in FIG. 3, the connection portions 91 can be drawn to directions substantially perpendicular to the extension directions of the connection wires 110, and front end faces thereof may substantially coincide with the extension directions of the connection wires 110. As a matter of course, the lead electrodes 90 and the connection wires 110 can be also suitably connected in this structure.

The drive IC 100 is installed on the sealing plate 30, and a compliance plate 40 including a sealing film 41 and-a fixing plate 42 is joined with a region corresponding to the reservoir portion 31 on the sealing plate 30. Herein, the sealing film 41 is made of a flexible material with low rigidity (e.g., a polyphenylene sulfide (PPS) film with a thickness of 6 μm), and one side of the reservoir portion 31 is sealed by the sealing film 41. The fixing plate 42 is formed of a hard material such as metal (e.g., stainless steel (SUS) with a thickness of 30 μm or the like). Since a region of the fixing plate 42 facing the reservoir 120 is an opening portion 43 completely removed in a thickness direction of the fixing plate 42, one side of the reservoir 120 is sealed by the flexible sealing film 41 alone.

The ink-jet recording head thus structured takes in ink from external ink supply means (not shown). After the inside of the ink-jet recording head is filled with the ink from the reservoir 120 to the nozzle orifices 21, voltage is applied between the upper electrode films 80 and the lower electrode film 60 according to recording signals from the drive IC 100 to deform with flexibility the elastic film 50, the lower electrode film 60 and the piezoelectric layers 70. As a result, the pressure in each pressure generating chamber 12 is increased, thus ejecting the ink droplets from the nozzle orifices 21.

Figure 4:
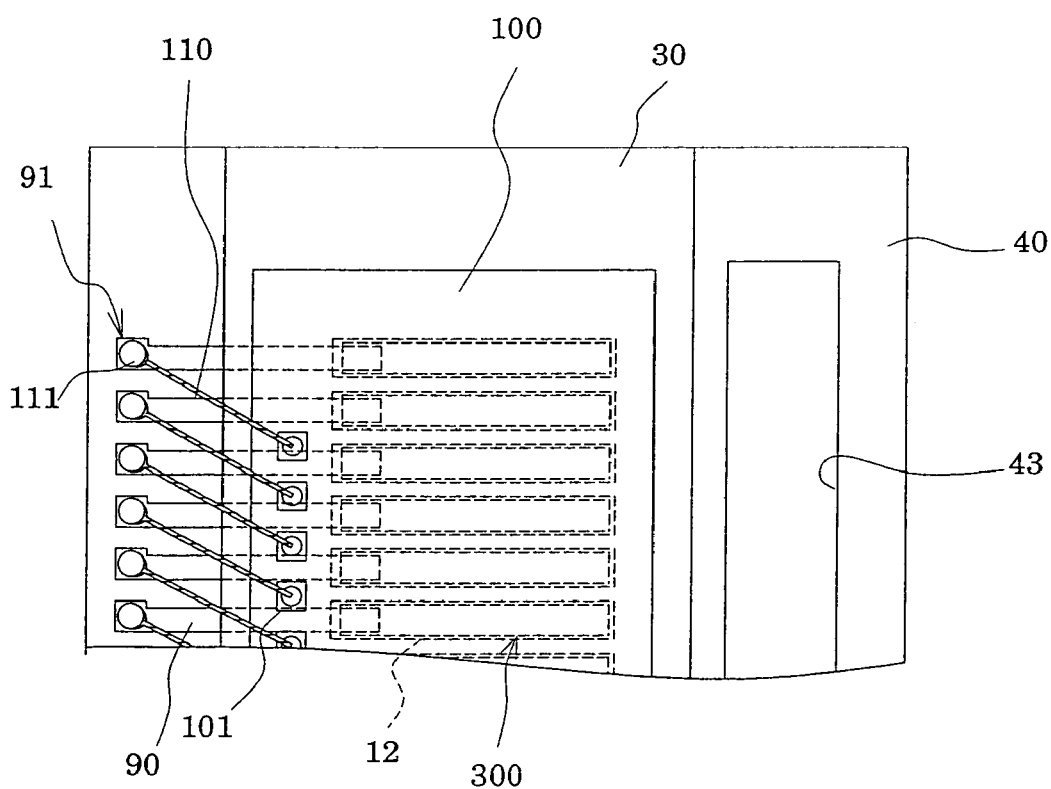
FIG. 4 is a plan view showing a modification example of the recording head according to Embodiment 1.

Note that, in the present embodiment, although the connection portions 91 of the lead electrodes 90 are drawn in the directions substantially perpendicular to the extension directions of the connection wires 110, the connection portions 91 are not limited to this. For example, as shown in FIG. 4, connection portions 91A may be formed by making the lead electrodes 90 wider than the other portions. In any case, it is sufficient for the connection portions 91A of the lead electrodes 90 to have shapes such that the bonding portions 111 of the connection wires 110 can be formed within the regions of the connection portions 91A.

Embodiment 2

Figure 5:
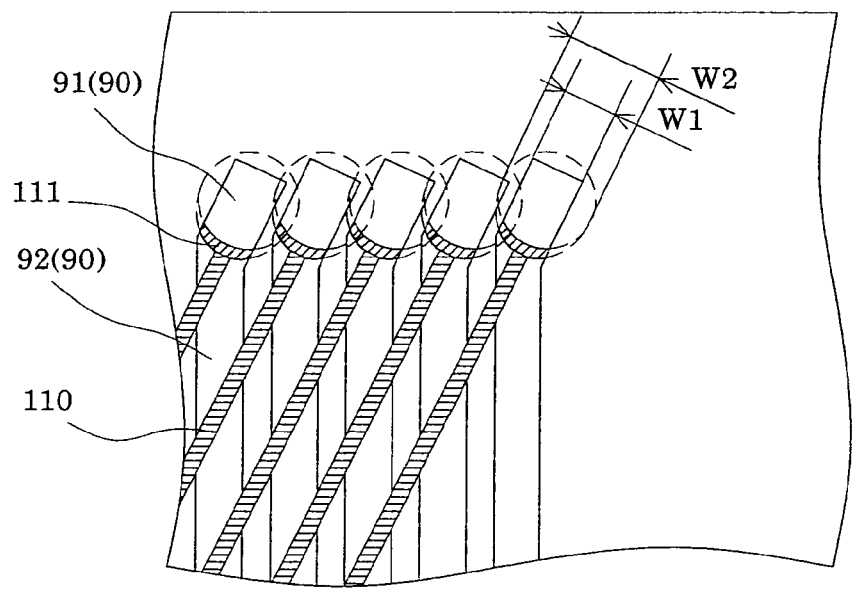
FIG. 5 is a plan view of a recording head according to Embodiment 2.

FIG. 5 is a plan view showing an essential part of an ink-jet recording head according to Embodiment 2. In Embodiment 1, the connection portions 91 of the lead electrodes 90 have such shapes that the connection wires 110 can be bonded within the regions of the connection portions 91. In other words, the connection portions 91 have sufficient areas so that the bonding portions 111 can be fit within the connection portions 91. However, in the present embodiment, as shown in FIG. 5, a width W1 of the connection portions 91 are formed to be smaller than the maximum width W2 of the bonding portions 111 and equal to or wider than ⅓ of the maximum width W2. In addition, the pitch of the adjacent connection portions 91 is made smaller than the maximum width W2 of the bonding portions 111. Note that the connection portions 91 are provided to be slanted along the extension directions of the connection wires 110 from the main body portions 92 in this structure.

As a result, a bonding strength which is the same as in the case where the bonding portions 111 of the connection wires 110 are fit in the connection portions 91 can be obtained. Accordingly, intervals between the lead electrodes 90 can be further narrowed by employing this structure. In other words, the array density of the piezoelectric elements can be further improved.

In the case where the intervals between the connection portions 91 of the lead electrodes 90 are narrowed, in other words, where the pitch of the connection portions 91 are made narrower than the maximum width W2 of the bonding portions 111, the bonding portions 111 of the connection wires 110 sometimes touch the connection portions 91 of the adjacent lead electrodes 90 when the connection wires 110 are bonded with the connection portions 91. Nevertheless, since the regions where bonding portions 111 touch the adjacent connection portions 91 are not portions which substantially affect the connection between the connection portions 91 and the connection wires 110, the adjacent lead electrodes 90 are not short-circuited. However, when the connection wires 110 are formed, the bonding portion 111 of each connection wire 110 is preferably formed to project toward a lead electrode 90 side to which the connection wire 110 is not connected.

(Examination 1)

Herein, the bonding strengths were measured in two samples; a sample (Comparison Example) in which the bonding portions 111 of the connection wires 110 are completely fit in the connection portions 91 of the lead electrodes 90; and a sample (Example) in which the widths of the connection portions 91 are narrowed so that approximately ⅓ of the areas of the bonding portions 111 are fit in the connection portions 91. Results thereof are listed in the Table 1 below. Note that the number of samples was 21 in both examples.

TABLE 1

|  | Bonding Strength (g) | | |
| --- | --- | --- | --- |
|  | Average | Maximum | Minimum |
| Example | 3.7 | 4.5 | 3 |
| Comparison Example | 3.8 | 5 | 3 |

As apparent from the results, when approximately ⅓ of the areas of the bonding portions 111 are fit in the connection portions 91 of the lead electrodes 90, similar bonding strengths of the connection wires 110 can be obtained as in the case where the bonding portions 111 are completely fit in the connection portions 91. In other words, if the width of the connection portions 91 is equal to or more than ⅓ of the maximum width of the bonding portions 111, the connection portions 91 and the connection wires 110 can be suitably connected. Thus, if the width of the connection portions 91 are smaller than the maximum width of the bonding portions 111 and equal to or larger than ⅓ of the maximum width, it is possible to further improve the array density of the piezoelectric elements 300 while the connection strengths between the connection portions 91 and the connection wires 110 are obtained.

Embodiment 3

Figure 6:
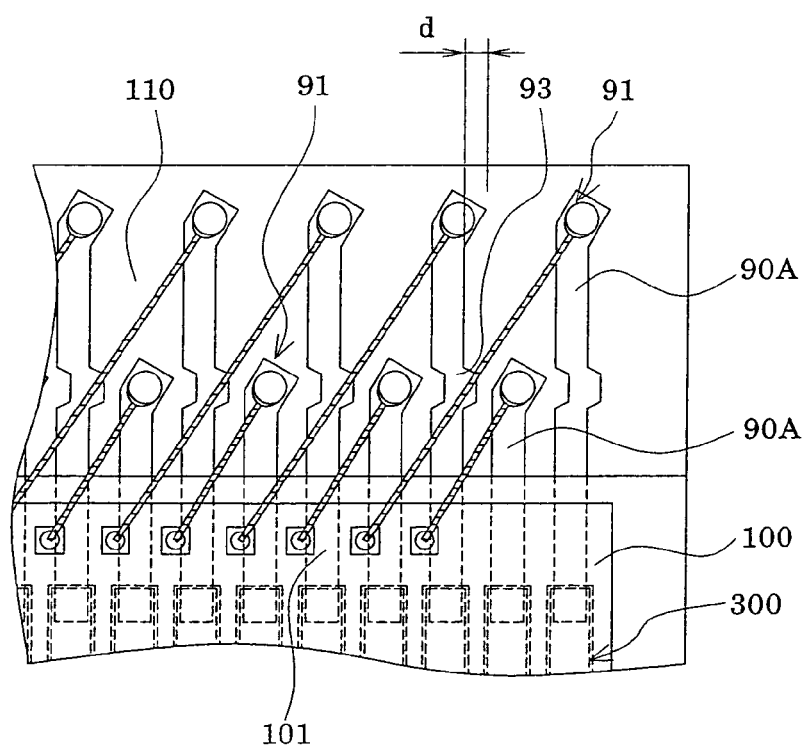
FIG. 6 is a plan view of a recording head according to Embodiment 3.

FIG. 6 is a schematic diagram showing a wiring structure of an ink-jet recording head according to Embodiment 3. The present embodiment is another example of the patterned shape of the lead electrodes 90. As shown in FIG. 6, the length of each lead electrode 90 of the present embodiment is formed to be different from that of the adjacent lead electrodes 90, and the connection portions 91 are arranged in a staggered manner. Similarly to Embodiment 1, the connection portions 91 are drawn in directions substantially perpendicular to the extension directions of the connection wires 110. In addition, each lead electrode 90 is arrayed in an interval narrower than a projection amount d of each connection portion 91, and concave portions 93 for preventing electrical contact with the connection portions 91 are provided in portions corresponding to the connection portions 91 of the adjacent lead electrodes 90.

Being thus structured, the lead electrodes 90 are not short-circuited even when the lead electrodes 90 are arrayed in relatively small intervals. Moreover, by arranging the connection portions 91 in a staggered manner, the intervals between the connection portions 91 are increased. Thus, it is possible to prevent the connection wires 110 from being mutually short-circuited. Therefore, even if the piezoelectric elements 300 are arrayed in high density, it is possible to suitably connect each piezoelectric element 300 and the drive IC 100 and improve printing quality and reliability.

Embodiment 4

Figure 7:
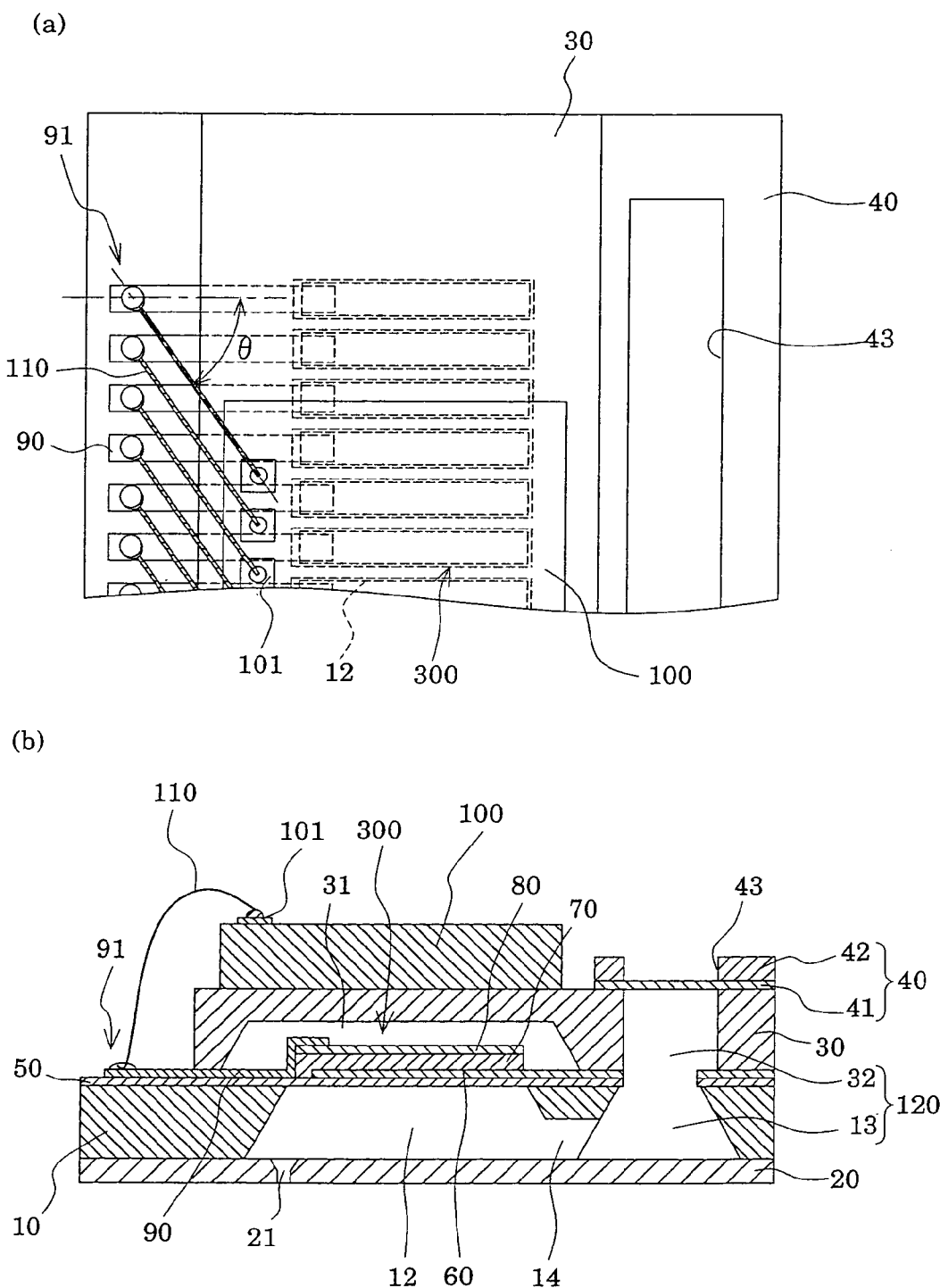
FIGS. 7(a) and 7(b) are a plan view and a sectional view of a recording head according to Embodiment 4, respectively.

FIGS. 7(a) and 7(b) are a plan view and a sectional view of an ink-jet recording head according to Embodiment 4. The present embodiment is an example in which an angle made when the connection wires 110 are connected to the connection portions 91 of the lead electrodes 90 is defined. To be more specific, as shown in FIG. 7(a) and 7(b), the lead electrodes 90 are linearly drawn to the vicinity of an edge of the passage-forming substrate 10 with a predetermined width, and the vicinities of front ends of the lead electrodes 90 are the connection portions 91 to which the connection wires 110 are connected. Note that, in the present embodiment, the piezoelectric elements 300 are formed with an array density of 360 dpi, and the lead electrodes 90 are formed with a width of 45 to 47 μm and a pitch of approximately 70 μm.

The connection wires 110 are extended in directions intersecting extension directions of the lead electrodes 90 and connected to connection portions 91. An angle made when the connection wires 110 are connected to the connection portions 91 of the lead electrodes 90, in other words, an angle α between the extension directions of the connection portions 91 of the lead electrodes 90 and the extension directions of the connection wires 110 is defined to be in a range of 45°±15°. In particular, the angle α is preferably around 55°

This enables suitable connections between the lead electrodes 90 and the connection wires 110. More specifically, by connecting the connection wires 110 at a predetermined angle with respect to drawing directions of the connection portions 91 of the lead electrodes 90, the connection areas of the connection portions 91 of the lead electrodes 90 and the connection wires 110 are substantially enlarged. Accordingly, the connection strength is improved. Furthermore, it is possible to prevent the lead electrodes 90 from being short-circuited by suppressing the projection amounts of the connection wires 110 from the lead electrodes 90. It is particularly effective if the structure is adopted in the case where the piezoelectric elements 300 are aligned with high density, for example, equal to or more than 200 dpi. This is because the width and the pitch of the lead electrodes 90 are narrowed, and the connection areas of the connection portions 91 of the lead electrodes 90 and the connection wires 110 are reduced when the piezoelectric elements 300 are arrayed in high density.

Additionally, even when the width of the lead electrodes 90 is relatively narrowed, the connection wires 110 can be suitably connected. Hence, the entire areas of the lead electrodes 90 can be relatively small. Thus, even when a relatively expensive material such as gold (Au) is employed, the manufacturing costs can be reduced.

(Examination 2)

An ink-jet recording head was prepared with the foregoing structure in Embodiment 3. Subsequently, connection states of the lead electrodes 90 and the connection wires 110 were examined when the two are connected by changing the angle θ with respect to the drawing directions of the lead electrodes 90. More specifically, short occurrence rates of the adjacent lead electrodes 90 and bonding strengths of the connection wires 110 with the lead electrodes 90 were examined. Results thereof are listed in Table 1 below. In the ink-jet recording heads used in this examination, the piezoelectric elements were arrayed in a density of 360 dpi, the width of the lead electrodes was approximately 46 μm, and the pitch thereof was approximately 70 μm.

TABLE 2

| Angle θ (°) | Number of Short Defect/Number of Tests | Defect Rate (%) | Bonding Strength (g) |
|---|---|---|---|
| 70 | 0/21 | 0 | 2.5 |
| 60 | 0/21 | 0 | 3.0 |
| 50 | 3/21 | 0 | 3.0 |
| 40 | 5/21 | 14 | 3.5 |
| 30 | 8/21 | 38 | 2.0 |
| 20 | 8/21 | 38 | 2.0 |
| 10 | 21/21 | 100 | 2.5 |
| 0 | 20/21 | 95 | 3.0 |

As shown in the above Table 2, the larger the angle θ between the extension directions of the connection portions 91 of the lead electrodes 90 and the extension directions of the connection wires 110 is, the lower the defect rate of the lead electrodes 90 due to a short circuit. Meanwhile, the bonding strength between the lead electrodes 90 and the connection wires 110 is the highest when the angle θ is set around 40°. The bonding strength is reduced when the angle θ is too large or small. As a result of overall examination of these data, it has been clarified that it is possible to prevent the lead electrodes 90 from being short-circuited and to suitably connect the lead electrodes 90 and the connection wires 110 when the angle θ between the drawing directions of the lead electrodes 90 and the drawing directions of the connection wires 110 is set around 45°±15°.

Figure 8:
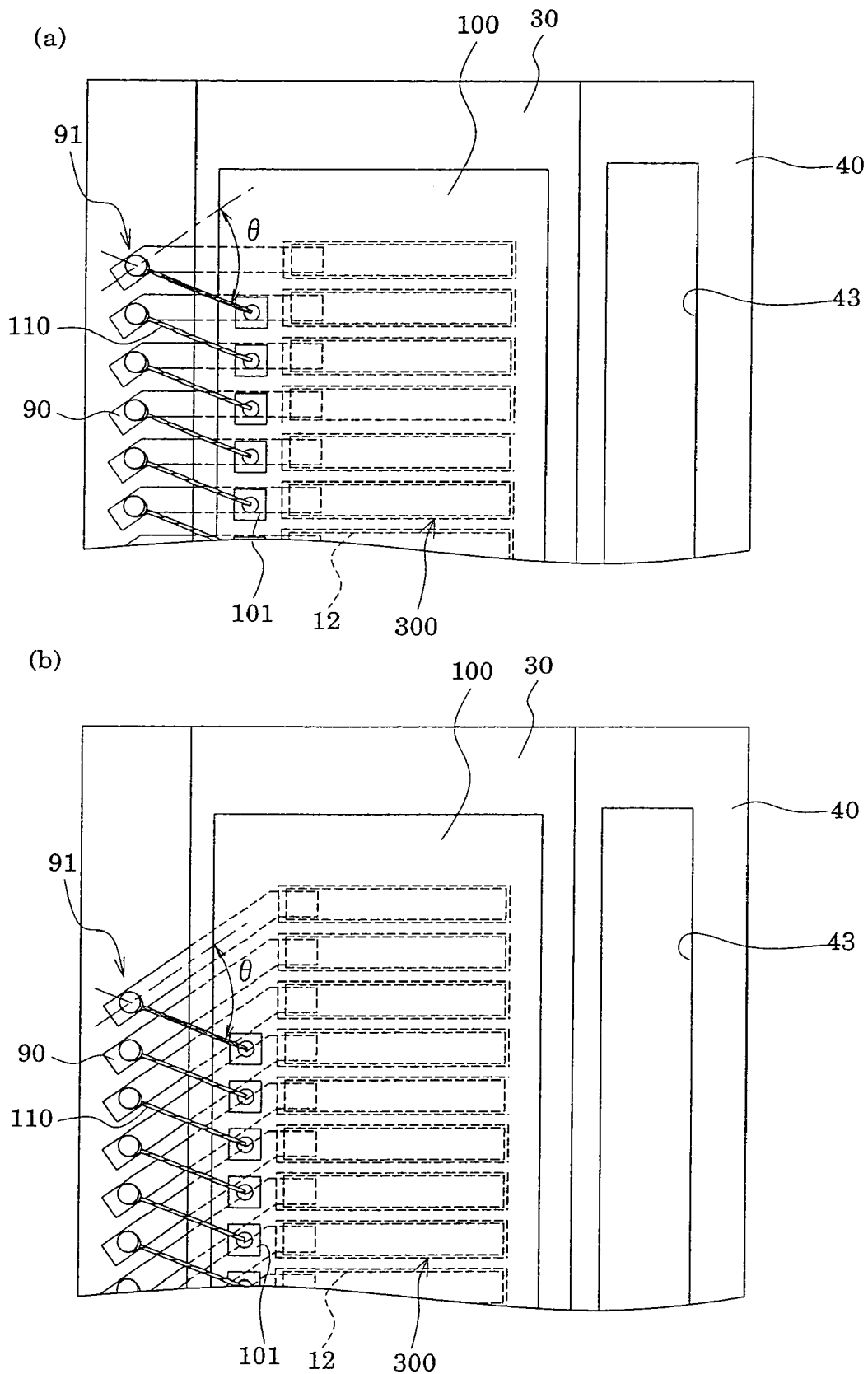
FIGS. 8(a) and 8(b) are plan views showing modification examples of the recording head according to Embodiment 4.

In the present embodiment, the example in which the lead electrodes 90 are linearly extended in a direction perpendicular to an aligning direction of the pad portions 101 of the drive IC 100 has been described. However, the extension directions of the lead electrodes 90 are not particularly limited. For example, as shown in FIG. 8(a), the connection portions 91 of the lead electrodes 90 may be extended in a direction different from the other portions. Alternatively, as shown in FIG. 8(b) the lead electrodes 90 may be linearly extended in a direction intersecting the aligning direction of the pad portions 101 of the drive IC 100 at a predetermined angle. In any case, as long as the angle between the extension directions of the connection portions 91 of the lead electrodes 90 and the extension directions of the connection wires 110 is within a range of 45°±15°, the lead electrodes 90 and the connection wires 110 can be suitably connected.

Moreover, even in the case of this structure, the lead electrodes 90 and the connection wires 110 can be suitably connected as long as the end face of the connection portions 91 are formed along the extension directions of the connection wires 110, similarly to Embodiment 1.

Furthermore, in the present embodiment, the example where the array pitch of the lead electrodes 90 drawn from the piezoelectric elements 300 are the same as the array pitch of the pad portions 101 of the drive IC 100. However, as a matter of course, as long as the angle θ between the extension directions of the connection portions 91 of the lead electrodes 90 and the extension directions of the connection wires 110 is in the range of 45°±15°, the array pitch of the lead electrodes 90 and the array pitch of the pad portions 101 of the drive IC may be different.

Embodiment 5

Figure 9:
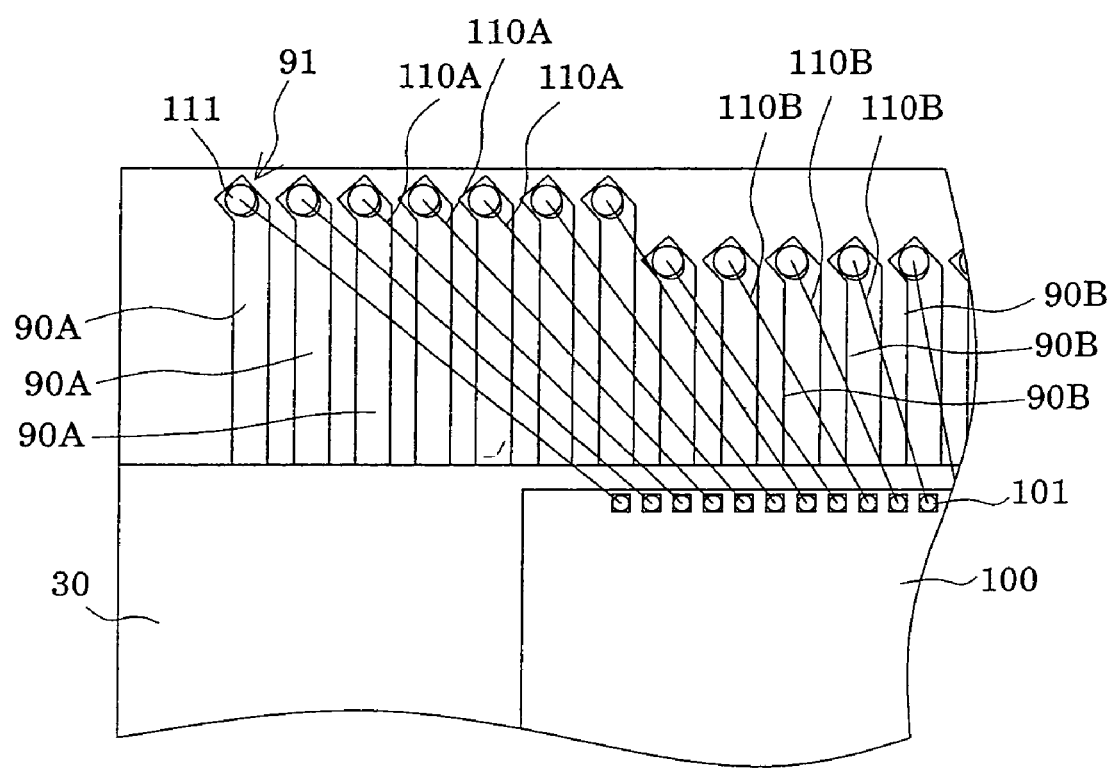
FIG. 9 is a plan view showing a recording head according to Embodiment 5.

FIG. 9 is a schematic diagram showing the wiring structure of an ink-jet recording head according to Embodiment 5. The present embodiment is an example in which the connection wires 110 connecting the drive IC 100 and the lead electrodes 90 provided in the vicinities of both ends of the passage-forming substrate 10 are made longer than the connection wires 110 connecting the drive IC 100 and the lead electrodes 90 provided in the central portion of the passage-forming substrate 10, thus preventing the connection defects between the connection wires 110 and the lead electrodes 90 due to thermal deformation of the head.

As shown in FIG. 9, in the present embodiment, the array pitch of the connection portions 91 of the lead electrodes 90 drawn from piezoelectric elements 300 are made wider than the array pitch of the pad portions 101 of the drive IC 100. Consequently, intersection angles between the connection wires 110 and the lead electrodes 90 become larger closer to the edges of the passage-forming substrate 10. Lead electrodes 90A provided in the vicinities of the edges of the passage-forming substrate 10 are made longer than lead electrodes 90B provided in the central portion of the passage-forming substrate 10. Thus, connection wires 110A provided in the vicinities of the edges of the passage-forming substrate 10 are made longer than connection wires 110B provided in the central portion.

In this structure, as for the connection wires 110A provided in the vicinities of the edges of the passage-forming substrate 10, the bonding portions 111 do not come off by pulling the connection wires 110A even when the head is warped by heat. This is because deformable areas of the connection wires 110A are larger than those of the connection wires 110B in the central portion. In other words, if the head is warped, a deformed amount is increased as closer to the edges of the passage-forming substrate 10. Thus, the connection wires 110A are more likely to come off. However, in the present embodiment, the connection wires 110A in the vicinities of the edges of the passage-forming substrate 10 are made longer than the connection wires 110B in the central portion. Accordingly, it is possible to effectively prevent the connection defects between the connection wires 111A and the lead electrodes 90A.

Figure 10:
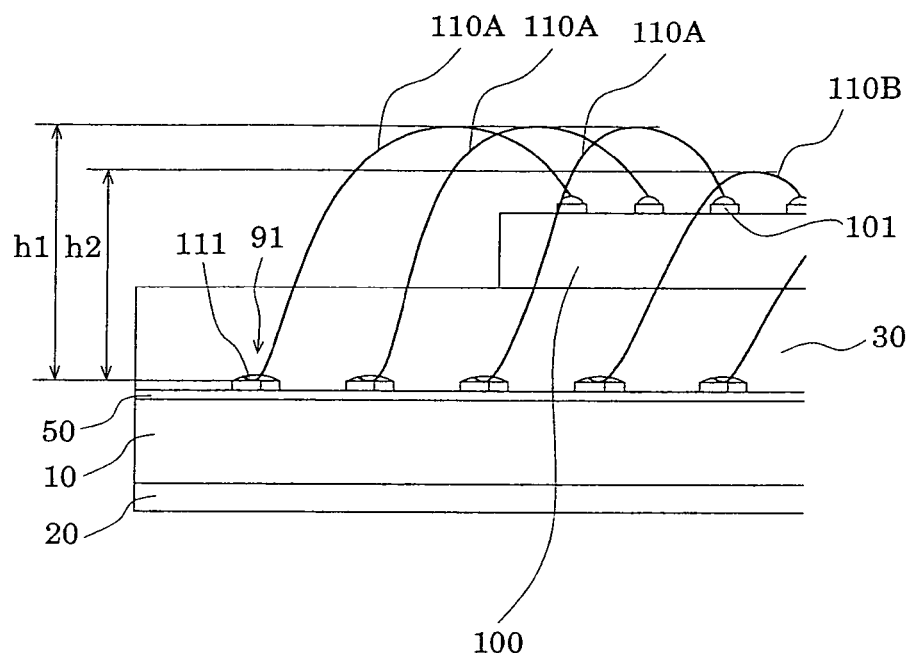
FIG. 10 is a side view showing a modification example of the recording head according to Embodiment 5.

Note that, in the present embodiment, the lengths of the connection wires 110 are changed by changing the lengths of the lead electrodes 90 (positions of connection portions 91). However, a way of changing the lengths of the connection wires 110 is not limited to this. For example, as shown in FIG. 10, the lengths of the lead electrodes 90 may be set substantially the same, and a height h1 of the connection wires 110A provided in the vicinities of the edges of the passage-forming substrate 10 may be set higher than a height h2 of the connection wires 110B provided in the central portion. In any case, the connection wires 110A provided in the vicinities of the edges of the passage-forming substrate 10 become longer. Thus, it is possible to prevent the connection defects between the connection wires 110A and the lead electrodes 90A even when the head is warped due to heat.

Figure 11:
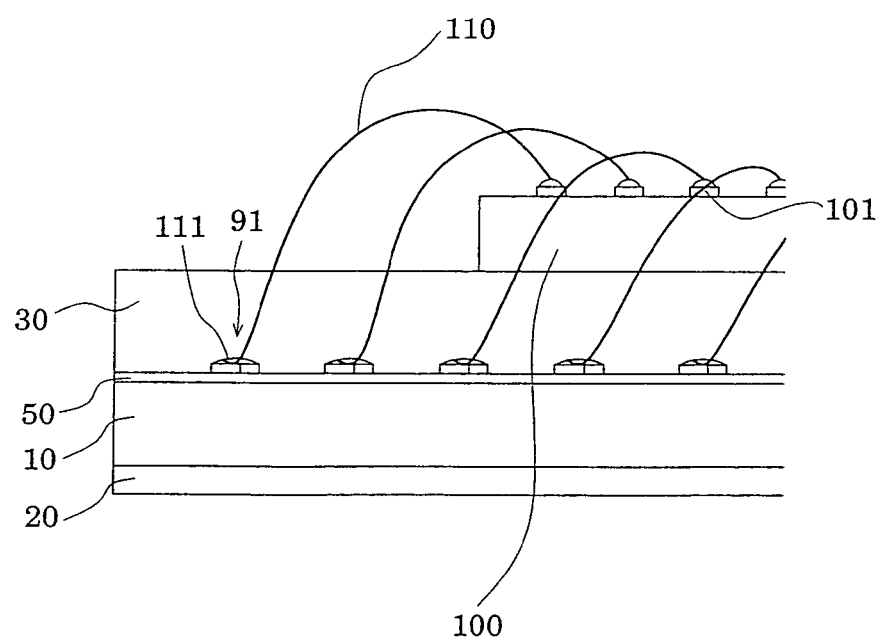
FIG. 11 is a side view showing a modification example of the recording head according to Embodiment 5.

Moreover, in the present embodiment, a plurality of the connection wires 110A provided in the vicinities of the edges of the passage-forming substrate 10 are formed to have substantially the same length. However, the length is not limited to this. For example, as shown in FIG. 11, the connection wires 110 provided closer to the edges of the passage-forming substrate 10 may become longer.

Other Embodiment

Hereinbefore, each embodiment of the present invention has been described. However, the basic structure of the ink-jet recording head is not limited to the foregoing embodiments.

For example, in the aforementioned embodiments, the structure has been illustrated in which the array pitch of the connection portions 91 of the lead electrodes 90 drawn from the piezoelectric elements 300 are equal to or wider than the array pitch of the pad portions 101 of the drive IC 100. However, as a matter of course, the present invention can be adopted even when the array pitch of the connection portions 91 of the lead electrodes 90 drawn from the piezoelectric elements 300 are made narrower than the array pitch of the pad portions 101 of the drive IC 100.

In the aforementioned embodiments, the ink-jet recording head including one column of rows of the pressure generating chambers 12 has been exemplified. However, as a matter of course, the present invention can be applied to an ink-jet recording head including two columns of rows of the pressure generating chambers 12. An example of this ink-jet-recording head will be described. Note that redundant descriptions of the structure of the aforementioned embodiments will be omitted, and the same reference numerals are used for the same members.

Figure 12:
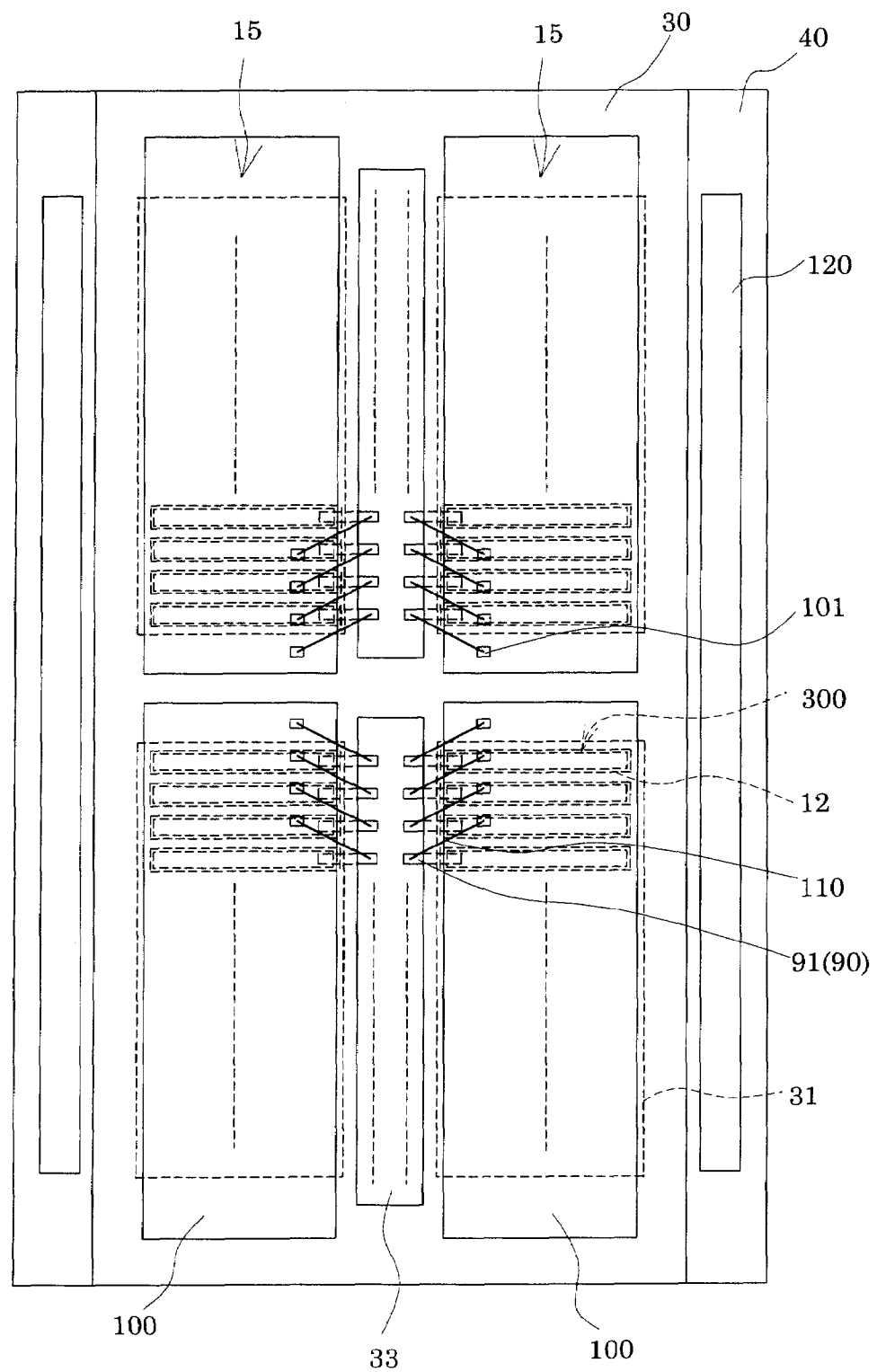
FIG. 12 is a plan view of a recording head according to another embodiment.

As shown in FIG. 12, in the ink-jet recording head according to the present embodiment, two columns 15 of a plurality of the aligned pressure generating chambers 12 in the width direction thereof are provided on the passage-forming substrate 10. On one side of the passage-forming substrate 10, the piezoelectric elements 300 are formed, and the sealing plate 30 having the piezoelectric element holding portion 31 which seals these piezoelectric elements 300 is joined. The reservoirs 120 are provided outside the columns 15 of the pressure generating chambers 12 for the respective columns 15, penetrating the passage-forming substrate 10 and the sealing plate 30.

In a region corresponding to an interval between the columns 15 of the pressure generating chambers 12 on the sealing plate 30, two penetrated portions 33 are provided. The lead electrodes 90 drawn from the piezoelectric elements 300 are exposed in the penetrated portions 33. In regions on both sides of the penetrated portions 33 facing the columns 15, the drive ICs 100 are mounted. More specifically, two drive ICs 100 are mounted for each column 15 of the piezoelectric elements 300 (pressure generating chambers 12), and the total of four drive ICs 100 are mounted. Each drive IC 100 is mounted on the sealing plate 30 so as to be positioned slightly closer to the center of a column 15 direction than the connection portions 91 of the lead electrodes 90 drawn from the piezoelectric elements 300 corresponding to the pad portions 101. The pad portions 101 of the drive ICs 100 and the connection portions 91 of the lead electrodes 90 are connected by the respective connection wires 110 extended in directions intersecting drawing directions of the lead electrodes 90. Specifically, the pad portions 101 of the drive ICs 100 are aligned in a slanted direction with respect to drawing directions of the connection wires 110, and the pad portions 101 and the connection portions 91 of the lead electrodes 90 are connected by the respective connection wires 110. Even to the ink-jet recording head thus structured, the structure described in the aforementioned embodiments can be applied, as a matter of course. At the same time, it is possible to obtain the same effects.

Moreover, for example, in the aforementioned embodiments, the example in which the ink-jet recording head of a thin film type manufactured utilizing deposition and lithography processes has been described. However, the ink-jet recording head is not limited to this, as a matter of course. For example, the present invention can be also adopted in an ink-jet recording head of a thick film type formed by a method of attaching a green sheet or the like.

Figure 13:
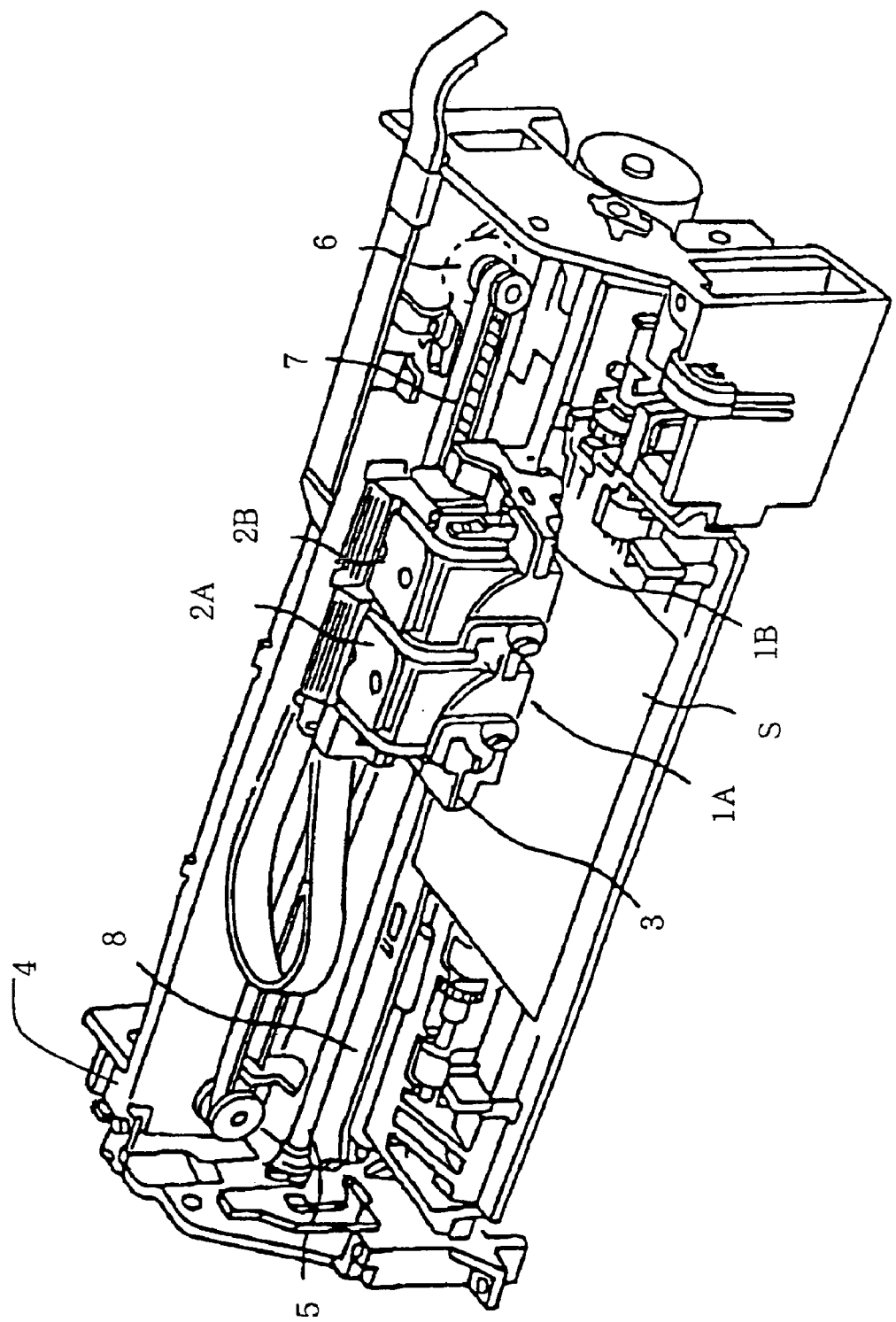
FIG. 13 is a schematic view of a recording apparatus according to an embodiment.

In addition, the ink-jet recording head of each embodiment, constituting part of a recording head unit including an ink passage communicating with an ink cartridge and the like, is installed in an ink-jet recording apparatus. FIG. 13 is a schematic view showing an example of the ink-jet recording apparatus. As shown in FIG. 13, cartridges 2(a) and 2(b) which constitute ink supply means are detachably attached to recording head units 1A and 1B having the ink-jet recording heads. A carriage 3 on which the recording head units 1A and 1B are installed is provided on a carriage shaft 5 attached to an apparatus main body 4 so as to be movable in an axial direction of the carriage shaft 5. These recording head units 1A and 1B eject, for example, a black ink composition and a color ink composition, respectively. Driving force of a drive motor 6 is transmitted to the carriage 3 through a plurality of gears (not shown) and a timing belt 7, thereby moving the carriage 3, on which the recording head units 1A and 1B are installed, along the carriage shaft 5. Meanwhile, a platen 8 is provided in the apparatus main body 4 along the carriage shaft 5, and a recording sheet S, which is a recording medium such as paper fed by a feeding roller (not shown) or the like, is conveyed on the platen 8.

In the present embodiment, the ink-jet recording head which ejects ink has been described as an example of a liquid jet head. However, the present invention targets a wide range of general liquid jet heads. Examples of the liquid jet heads are a recording head employed in an image recording apparatus such as a printer, a color material jet head used for manufacturing color filters of a liquid crystal display and the like, an electrode material jet head used for forming electrodes of an organic EL display, a field emission display (FED) and the like, and a bio-organic matter jet head used for manufacturing biochips.

INDUSTRIAL APPLICABILITY

Having thus explained, the drawn electrodes and the connection wires can be securely connected by bonding in the present invention. Even when the piezoelectric elements 300 are arrayed in high density, the lead electrodes and the connection wires can be electrically connected securely.

Moreover, by making the connection wires provided in the vicinities of the edges of the passage-forming substrate longer than the connection wires provided in the central portion, it is possible to improve the reliability without causing connection defects between the connection wires and the drawn wires even when the head is warped due to heat.

The invention claimed is:

1. A liquid jet head comprising a passage-forming substrate on which pressure generating chambers communicating with nozzle orifices are formed, and piezoelectric elements including a lower electrode, piezoelectric layers and upper electrodes provided on one side of the passage-forming substrate through a vibration plate;
   wherein connection portions of drawn wires drawn from the piezoelectric elements and pad portions of a drive IC for driving the piezoelectric elements are connected by connection wires formed by wire bonding and extended in directions intersecting drawing directions of the connection portions of the drawn wires; and
   wherein the connection portions are provided to be slanted along extension directions of the connection wires from main body portions of the drawn wires, and a width of the connection portions is narrower than a maximum width of bonding regions of the connection wires and equal to or wider than ⅓ of the maximum width.

2. The liquid jet head according to claim 1, wherein a pitch of the adjacent connection portions is narrower than a maximum width of the bonding regions of the connection wires.

3. The liquid jet head according to claim 1, wherein the pressure generating chambers are formed by performing anisotropic etching on a single crystal silicon substrate, and each layer of the piezoelectric element is formed by deposition and lithography methods.

4. A liquid jet head comprising a passage-forming substrate on which pressure generating chambers communicating with nozzle orifices are formed, and piezoelectric elements including a lower electrode, piezoelectric layers and upper electrodes provided on one side of the passage-forming substrate through a vibration plate,
   wherein drawn wires drawn from the piezoelectric elements to the passage-forming substrate and pad portions of a drive IC for driving the piezoelectric elements are connected by connection wires formed by wire bonding, and an angle, within a plane substantially parallel to the plane of the passage-forming substrate, between extension directions of the connection wires and extension directions of connection portions, to which the connection wires are connected, of the drawn wires is in a range of 45°±15°.

5. The liquid jet head according to claim 4, wherein a width of the drawn wires is equal to or narrower than a width of the pad portions provided in the drive IC.

6. The liquid jet head according to claim 4, wherein a pitch of the drawn wires and a pitch of the pad portions provided in the drive IC are the same.

7. The liquid jet head according to claim 4, wherein a sealing plate having a piezoelectric element holding portion in a region facing the piezoelectric elements is joined with a side of the passage-forming substrate where the piezoelectric elements are formed, and the drive IC is installed on the sealing plate.

8. The liquid jet head according to claim 4, wherein the pressure generating chambers are formed by performing anisotropic etching on a single crystal silicon substrate, and each layer of the piezoelectric elements is formed by deposition and lithography methods.

9. A liquid jet apparatus comprising a liquid jet head in any one of claims 1, 2, 4, 7, 3, and 8.

* * * * *